(12) United States Patent
Lin et al.

(10) Patent No.: US 7,439,544 B2
(45) Date of Patent: Oct. 21, 2008

(54) STRUCTURE AND MANUFACTURING METHOD OF AN IMAGE TFT ARRAY

(75) Inventors: Chin-Mao Lin, Chiayi (TW); Kei-Hsiung Yang, Tao-Yuan Hsien (TW); Chian-Chih Hsiao, Taipei Hsien (TW)

(73) Assignee: HannStar Display Corp., Yang-Mei, Tao-Yuan Hsien (TW)

( * ) Notice: Subject to any disclaimer, the term of this patent is extended or adjusted under 35 U.S.C. 154(b) by 248 days.

(21) Appl. No.: 10/907,998

(22) Filed: Apr. 25, 2005

(65) Prior Publication Data
US 2006/0183263 A1  Aug. 17, 2006

(30) Foreign Application Priority Data
Feb. 16, 2005  (TW) .............................. 94104540 A

(51) Int. Cl.
*H01L 27/14* (2006.01)
(52) U.S. Cl. ............... 257/72; 257/E31.047; 257/49; 257/79; 257/296; 257/298; 257/59; 257/414
(58) Field of Classification Search ............ 257/290, 257/49, 59, 72, 79, 296, 298, 414, E31.047
See application file for complete search history.

(56) References Cited

U.S. PATENT DOCUMENTS

| | | | |
|---|---|---|---|
| 6,465,824 B1 * | 10/2002 | Kwasnick et al. ........... 257/290 |
| 6,465,861 B1 | 10/2002 | Liu et al. | |
| 6,680,216 B2 | 1/2004 | Kwasnick et al. | |
| 6,764,900 B2 * | 7/2004 | Shih ........................... 438/241 |
| 7,205,571 B2 * | 4/2007 | Ahn et al. ...................... 257/72 |

FOREIGN PATENT DOCUMENTS

TW         588463         5/2004

\* cited by examiner

*Primary Examiner*—Matthew C. Landau
*Assistant Examiner*—Minchul Yang
(74) *Attorney, Agent, or Firm*—Winston Hsu

(57) ABSTRACT

The present invention provides a manufacturing method of an image TFT array, which includes providing a substrate including a thin film transistor region, a storage capacitor region, a pad region, and a common electrode region, forming a photoresist layer on the substrate, and performing a photolithographic and etching process by utilizing a half-tone mask to pattern the photoresist layer to define a position of a through hole on the storage capacitor region and form the photoresist layer of a first thickness on the thin film transistor region and the photoresist layer of a second thickness on the region between the thin film transistor region and the storage capacitor region, wherein the first thickness is greater than the second thickness.

4 Claims, 22 Drawing Sheets

STRUCTURE AND MANUFACTURING METHOD OF AN IMAGE TFT ARRAY

BACKGROUND OF INVENTION

1. Field of the Invention

The present invention relates to a structure and a manufacturing method of an image TFT array, and more particular, to a structure and a manufacturing method of an image TFT array of an X-ray image sensor.

2. Description of the Prior Art

Recently, electronic matrix arrays find considerable application in X-ray image sensors. Such X-ray image sensors generally include scanning lines and data lines transversely and longitudinally spaced apart and across at an angle to one another, thereby forming a plurality of crossover points. Associated with each crossover point is an element or a pixel to be selectively addressed. These elements in many instances are memory cells or pixels of an electronically adjustable memory array or X-ray image TFT array.

A manufacturing method of an X-ray image TFT array according to the prior art includes seven photolithographic and etching processes. At first, the seven processes are concisely described as follows.

The first photolithographic and etching process includes forming a first metal layer and performing a photolithographic and etching process to form a lower electrode and a common electrode;

The second photolithographic and etching process includes forming a first insulating layer (SiNx) and a second metal layer in sequence and performing a photolithographic and etching process to form a gate, a pad, and an upper electrode;

The third photolithographic and etching process includes forming a second insulating layer (SiNx or SiNx/SiOx/SiNx), an amorphous-silicon layer, and a doping layer such as an n+ amorphous-silicon layer in sequence, and performing a photolithographic and etching process to define a semiconductor island;

The fourth photolithographic and etching process includes performing a photolithographic and etching process, especially a photolithographic and wet etching process, to form through holes on a storage capacitor, common electrode, and pad;

The fifth photolithographic and etching process includes forming a third metal layer and performing a photolithographic, a third metal layer wet etching, and a channel etching process, especially a channel dry etching process, to define the third metal layer and the back channel regions of thin film transistors;

The sixth photolithographic and etching process includes forming a passivation layer and performing a photolithographic and etching process to form a through hole on the insulating layer for forming a storage capacitor; and The seventh photolithographic and etching process includes performing a photolithographic and etching process to form pixel electrodes of thin film transistors and outer test patterns to complete the manufacturing method of an X-ray image TFT array according to the prior art.

Next, the above manufacturing method is interpreted with FIG. 1 to FIG. 6 as follows. FIG. 1 to FIG. 6 are schematic diagrams of a manufacturing method for a thin film transistor (TFT) array 10 for an X-ray image TFT array according to the prior art. As shown in FIG. 1, a substrate 12 is provided. The substrate 12 can be a transparent glass or quartz substrate. Then, a first metal layer (not shown in FIG. 1) is deposited on the substrate 12. A first photolithographic and etching process is performed to remove a portion of the first metal layer to form a lower electrode 16 and a common electrode 18.

As shown in FIG. 2, a first insulating layer 20 and a second metal layer (not shown in FIG. 2) are deposited on the substrate 12 in sequence. A second photolithographic and etching process is performed to remove a portion of the second metal layer to form a gate 24, an upper electrode 26, and a pad 28 on the first insulating layer 20. It is noted that the lower electrode 16, the first insulating layer 20, and the upper electrode 26 constitute a storage capacitor.

Please refer to FIG. 3. A second insulating layer 30, an amorphous-silicon layer 32, and a doping layer 34 are deposited on the substrate 12. A third photolithographic and etching process is performed to remove a portion of the amorphous-silicon layer 32 and the doping layer 34 to define a semiconductor island 36.

As shown in FIG. 4, a fourth photolithographic and etching process, especially a photolithographic and wet etching process, is performed to remove a portion of the second insulating layer 30 and the first insulating layer 20 to form a first through hole 38 on the storage capacitor, a second through hole 40 on the pad 28, and a third through hole 42 on the common electrode 18.

As shown in FIG. 5, a third metal layer 44 is formed on the substrate 12. A fifth photolithographic and etching process, especially a photolithographic and wet etching process, is performed to remove a portion of the third metal layer 44 and a etching process, especially a dry etching process, is performed to form a channel 46 to define the third metal layer 44.

As shown in FIG. 6, a passivation layer 48 is deposited. A sixth photolithographic and etching process is performed to remove a portion of the passivation layer 48 to form a fourth through hole 50 on the storage capacitor. Finally, a seventh photolithographic and etching process is performed to form outer test patterns (not shown in FIG. 6) to complete the manufacturing method of the X-ray image TFT array 10 according to the prior art.

There are as many as seven photolithographic and etching processes in the prior art. Due to the high number of photolithographic and etching processes, the particle issue produced in the transferring and etching process is more serious. Moreover, since the manufacturing process is complicated, the manufacturing time is longer and the quantity of output is influenced.

For simplifying the above-mentioned process of the manufacturing method of an X-ray image TFT array, U.S. Pat. No. 6,764,900 discloses a manufacturing method that applies a half-tone process in an image TFT array. Please refer to FIG. 7 and FIG. 8. FIG. 7 and FIG. 8 are schematic diagrams of a manufacturing method that applies a half-tone process in an image TFT array. As shown in FIG. 7, a second insulating layer 1110 is situated on a gate 1020 and a substrate 1000. The gate 1020 is composed of a first metal. Then, an amorphous-silicon layer 1120, a doping layer 1130, and a conductive layer 1140 are deposited on the second insulating layer 1110 in sequence. A half-tone process is performed to form a patterned photoresist layer 1150 on the conductive layer 1140.

As shown in FIG. 8, utilizing the patterned photoresist layer 1150 as a mask, several etching processes are performed to remove a portion of the conductive layer 1140, the doping layer 1130, and the amorphous-silicon layer 1120 to form a common electrode 1210 on a first semiconductor island 1220 and a source region 1230, a drain region 1240, and a data line 1250 on a second semiconductor island 1260. The source region 1230, the drain region 1240, and the data line 1250 on the second semiconductor island 1260 form a thin film transistor structure.

However, U.S. Pat. No. 6,764,900 discloses that a half-tone process is applied for forming a common electrode and a thin film transistor, and does not disclose that the half-tone process could be applied for forming a thin film transistor, a storage capacitor, a common electrode, and a pad simultaneously. Furthermore, a structure of the X-ray image TFT array according to U.S. Pat. No. 6,764,900 is different from the present invention.

SUMMARY OF INVENTION

It is therefore an object of the present invention to provide a structure and manufacturing method of an image TFT array to resolve the above problems.

The present invention discloses a manufacturing method of an image TFT array as follows. A substrate is provided, wherein the substrate includes at least a thin film transistor, at least a storage capacitor, at least a pad, and at least a common electrode. A photoresist layer is formed on the substrate. The photoresist layer is patterned by utilizing a half-tone mask, wherein the photoresist layer exposes a portion of the storage capacitor to define at least a position of a through hole. Furthermore, the photoresist layer of a first thickness covers the thin film transistor and the photoresist layer of a second thickness covers the region between the thin film transistor and the storage capacitor, wherein the first thickness is greater than the second thickness. A first etching process is performed by utilizing the photoresist layer as a mask to remove a doping layer, an amorphous-silicon layer, and an insulating layer on the storage capacitor to form a first through hole. A photoresist layer ashing process is performed to totally remove the photoresist layer covering the region between the thin film transistor and the storage capacitor and partially remove the photoresist layer covering the thin film transistor. A second etching process is performed by utilizing the photoresist layer covering the thin film transistor as a mask to remove the doping layer and the amorphous-silicon layer on the region between the thin film transistor and the storage capacitor to define a semiconductor island on the thin film transistor. Finally, the photoresist layer covering the thin film transistor is removed.

The present invention further discloses a structure of an image TFT array of an X-ray sensor. The structure of an image TFT array forming on a substrate includes a storage capacitor structure, which includes a first metal layer, a first insulating layer, a second metal layer, a second insulating layer, an amorphous-silicon layer, a doping layer, a third metal layer, and a passivation layer covering the substrate in sequence, a thin film transistor structure, which includes the first insulating layer, the second metal layer, the second insulating layer, the amorphous-silicon layer, the doping layer, the third metal layer, and the passivation layer covering the substrate in sequence, a pad structure, which includes the first insulating layer, the second metal layer, the second insulating layer, the amorphous-silicon layer, the doping layer, the third metal layer, and the passivation layer covering the substrate in sequence, and a common electrode structure, which includes the first metal layer, the first insulating layer, the second insulating layer, the amorphous-silicon layer, the doping layer, the third metal layer, and the passivation layer covering the substrate in sequence. Furthermore, the storage capacitor structure, the pad structure, and the common electrode structure further include a first through hole, a second through hole, and a third through hole respectively to let the third metal layer electrically connect to the second metal layer of the storage capacitor structure, the second metal layer of the pad structure, and the first metal layer of the common electrode structure respectively, and the storage capacitor structure further includes a fourth through hole for exposing a portion of the third metal layer.

The present invention utilizes a half-tone process to integrate the manufacturing process of through holes on a storage capacitor, a pad, and a common electrode, and the manufacturing process of a semiconductor island on a thin film transistor. The present invention is capable of saving a photolithographic and etching process such that the particle issue produced in the transferring and etching process because of high number photolithographic and etching process in the prior art will be improved. Therefore, the present invention is capable of simplifying the manufacturing process, shortening the manufacturing time, and increasing the quantity of output. Furthermore, the structure of an image TFT array of the present invention is manufactured by utilizing a simpler half-tone mask to achieve the object of saving a photolithographic and etching process, and therefore the cost of the image TFT array is reduced.

These and other objectives of the present invention will no doubt become obvious to those of ordinary skill in the art after reading the following detailed description of the preferred embodiment that is illustrated in the various figures and drawings.

DETAILED DESCRIPTION

A manufacturing method of an image TFT array according to a first embodiment of the present invention is described as follows.

The first photolithographic and etching process includes forming a first metal layer and performing a photolithographic and etching process to form a lower electrode and a common electrode;

The second photolithographic and etching process includes forming a first insulating layer (SiNx) and a second metal layer in sequence and performing a photolithographic and etching process to form a gate, an upper electrode, and a pad;

The third photolithographic and etching process includes forming a second insulating layer (SiNx or SiNx/SiOx/SiNx), an amorphous-silicon layer, and a doping layer such as an n+ amorphous-silicon layer in sequence, and performing a half-tone process to form a first through hole on a storage capacitor, a second through hole on the pad, and a third through hole on the common electrode, and then defining a semiconductor island on a thin film transistor;

The fourth photolithographic and etching process includes forming a third metal layer and performing a photolithographic, a third metal layer wet etching, and a channel etching process, especially a channel dry etching process, to define the third metal layer and back channel regins of TFTs;

The fifth photolithographic and etching process includes forming a passivation layer and performing a photolithographic and etching process to form a fourth through hole on the insulating layer for forming a storage capacitor; and The sixth photolithographic and etching process includes performing a photolithographic and etching process to form pixel electrodes of TFTs and outer test patterns to complete the manufacturing method of an image TFT array according to the first embodiment of the present invention.

Figure 1:
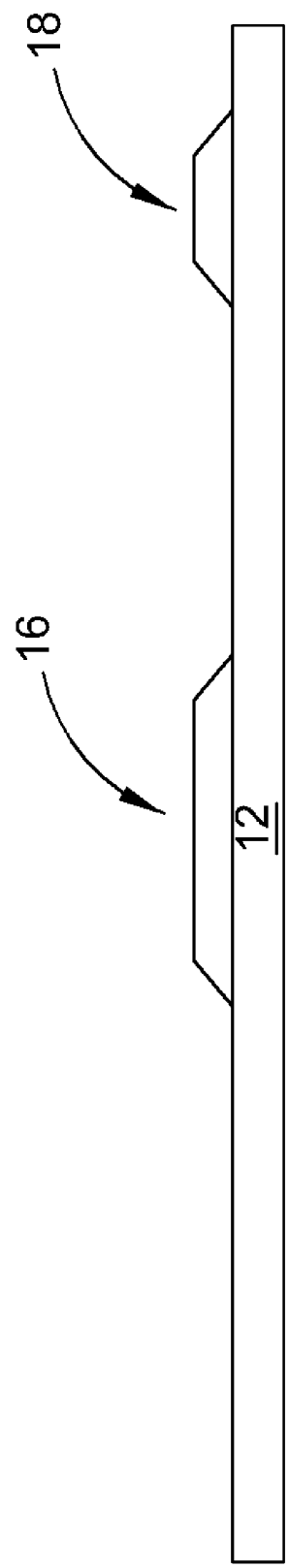
FIG. 1 to FIG. 6 are schematic diagrams of a manufacturing method for a TFT array for an X-ray image TFT array according to the prior art.
Figure 2:
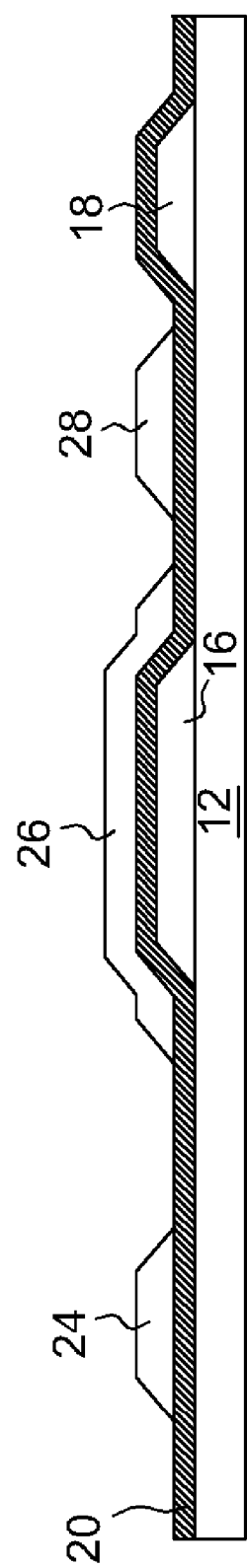
Figure 3:
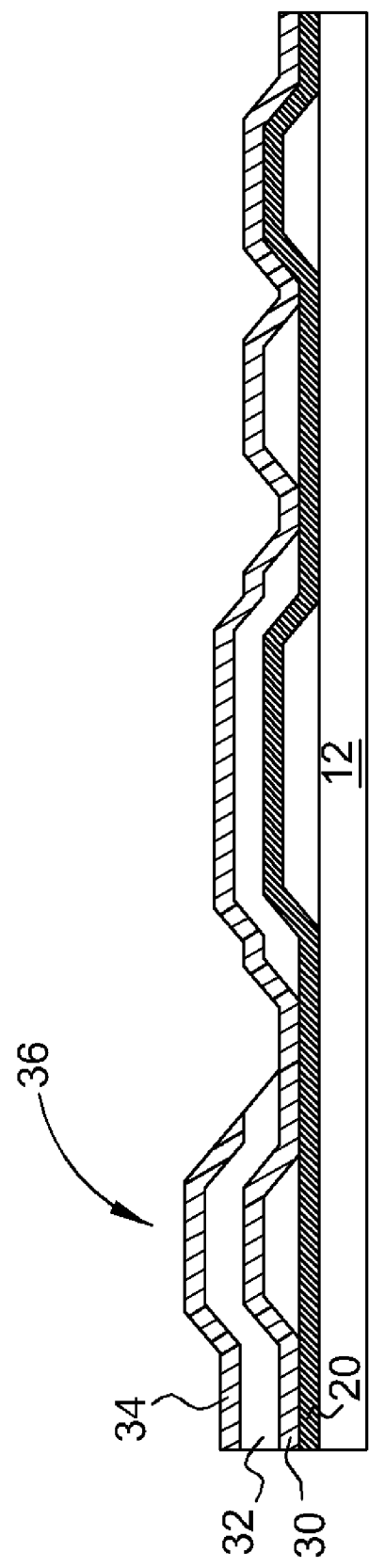
Figure 4:
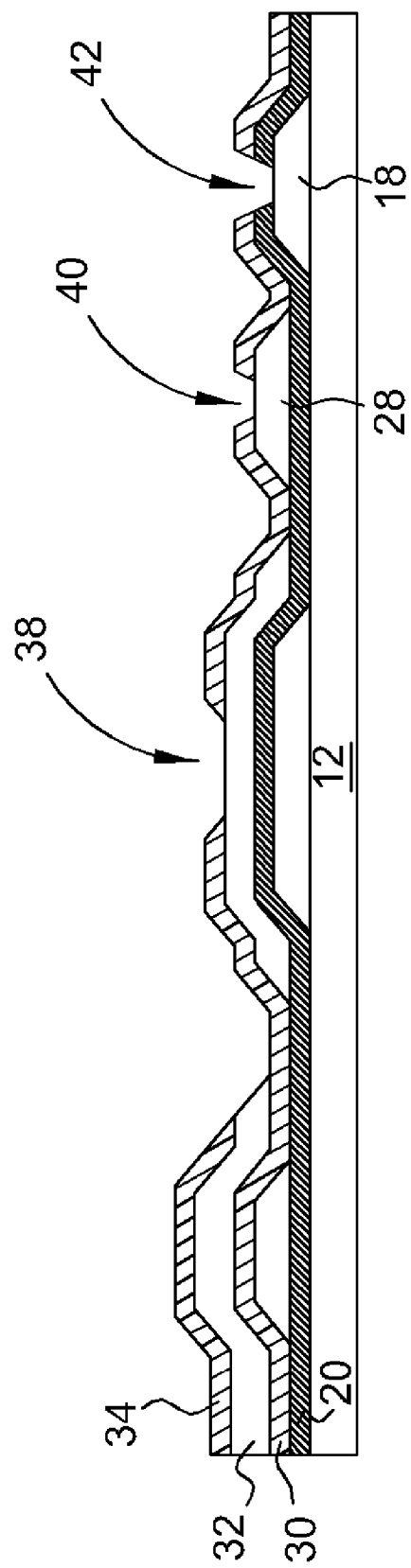
Figure 5:
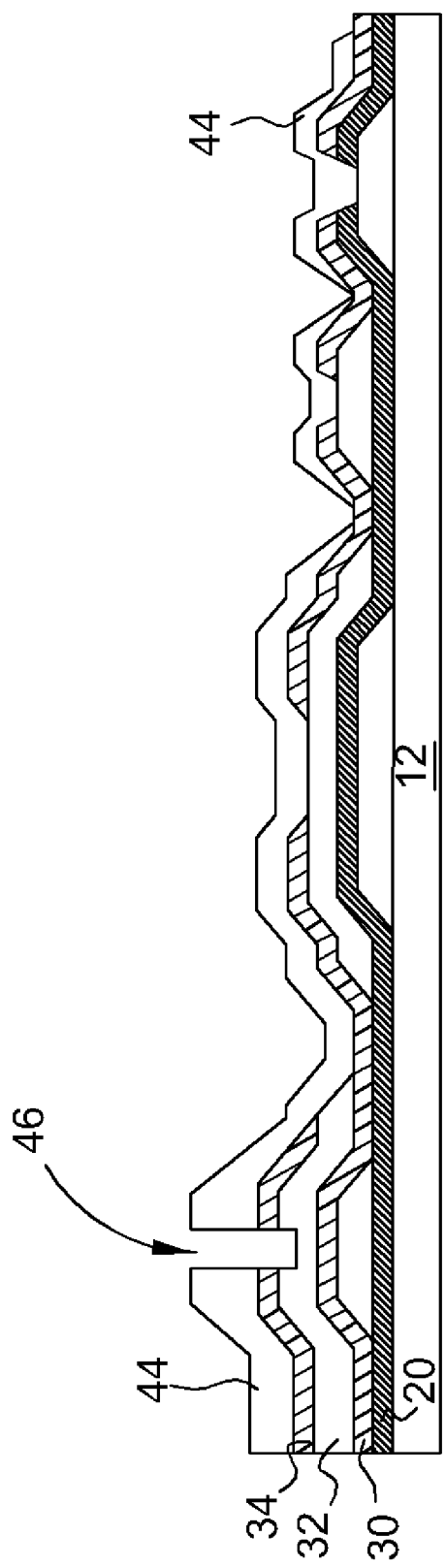
Figure 6:
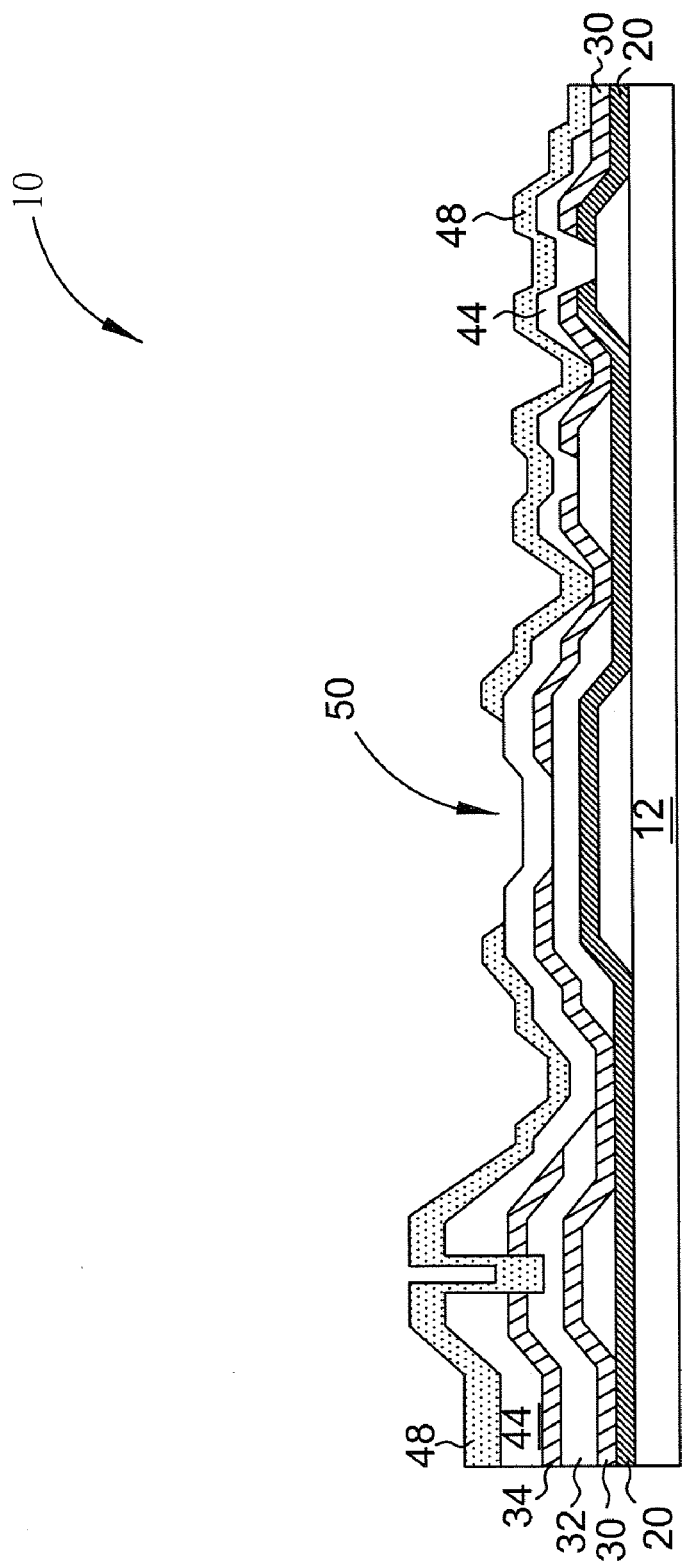
Figure 7:
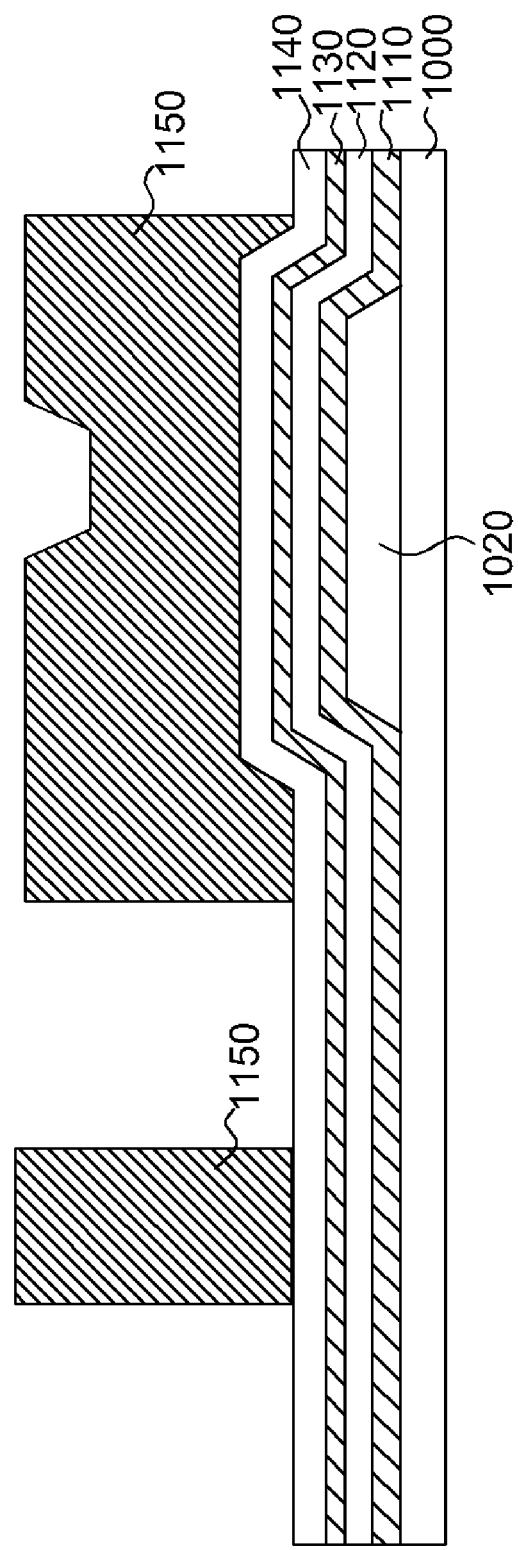
FIG. 7 and FIG. 8 are schematic diagrams of a manufacturing method that applies a half-tone process in an image TFT array.
Figure 8:
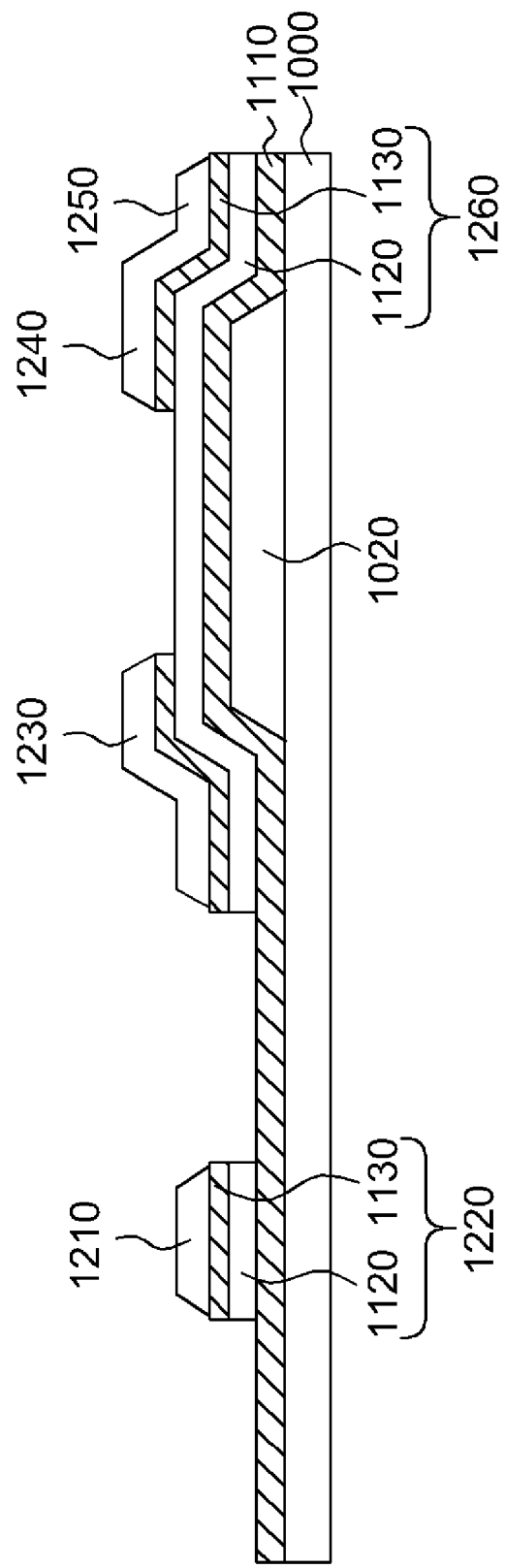
Figure 9:
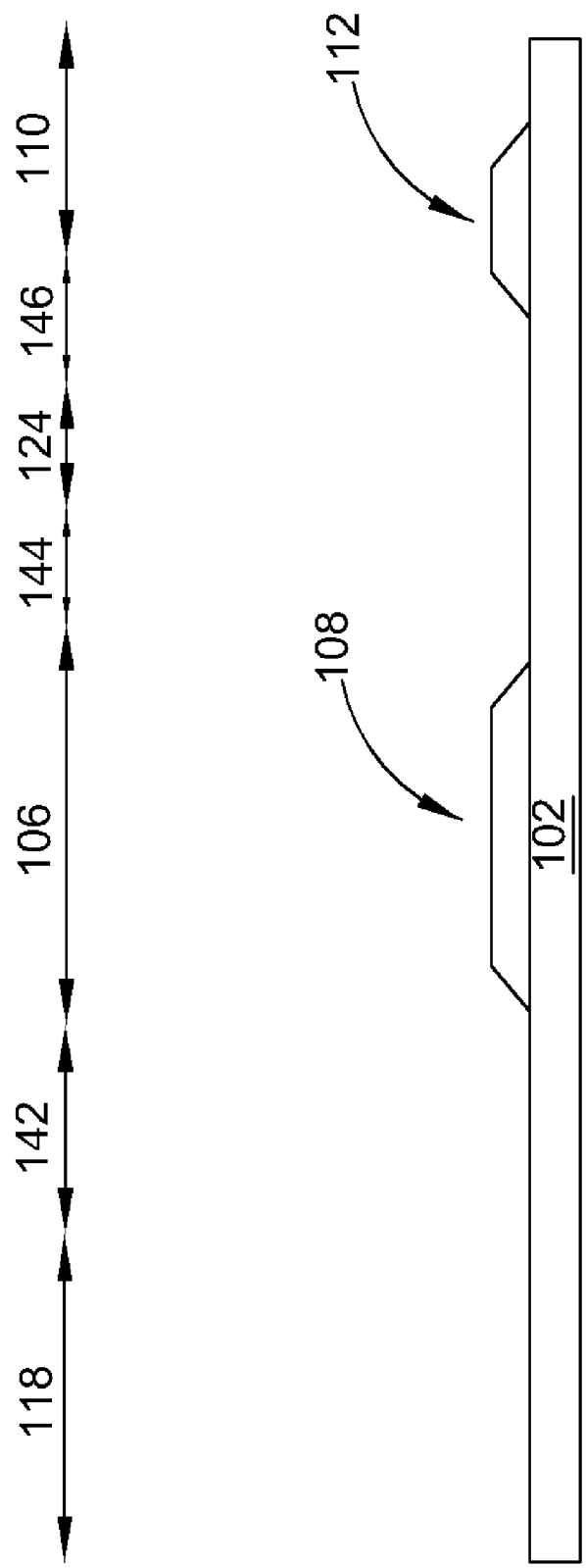
FIG. 9 to FIG. 15 are schematic diagrams of a manufacturing method of an image TFT array according to a first embodiment of the present invention.

Please refer to FIG. 9 to FIG. 15. FIG. 9 to FIG. 15 are schematic diagrams of a manufacturing method of an image TFT array 100 according to a first embodiment of the present invention. As shown in FIG. 9, a substrate 102 is provided, and the substrate 102 includes a thin film transistor region 118, a first region 142, a storage capacitor region 106, a second region 144, a pad region 124, a third region 146, and a common electrode region 110. Therein, the first region 142 means the region between the thin film transistor region 118 and the storage capacitor region 106, the second region 144 means the region between the storage capacitor region 106 and the pad region 124, and the third region 146 means the region between the pad region 124 and the common electrode region 110. The substrate 102 can be a transparent glass or quartz substrate. Then, a first metal layer (not shown in FIG. 9) is deposited on the substrate 102. A first photolithographic and etching process is performed to pattern the first metal layer to form a lower electrode 108 on the storage capacitor region 106 and a common electrode 112 on a common electrode region 110.

Figure 10:
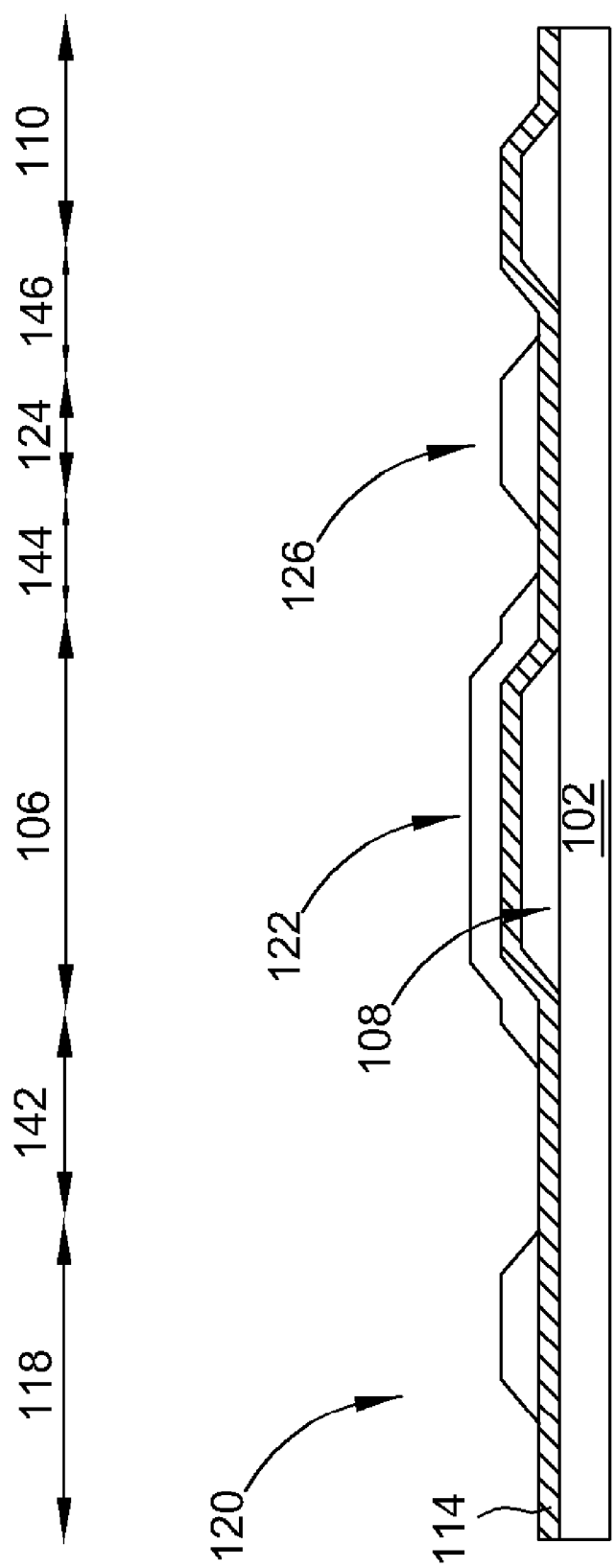

A shown in FIG. 10, a first insulating layer 114 and a second metal layer (not shown in FIG. 10) are deposited on the substrate 102 in sequence. A second photolithographic and etching process is performed to pattern the second metal layer to form a gate 120 on the thin film transistor region 118, an upper electrode 122 on the storage capacitor region 106, and a pad 126 on the pad region 124 covering the first insulating layer 114. Therein, the lower electrode 108, the first insulating layer 114, and the upper electrode 122 constitute a metal-insulator-metal (MIM) structure to form a storage capacitor.

Figure 11:
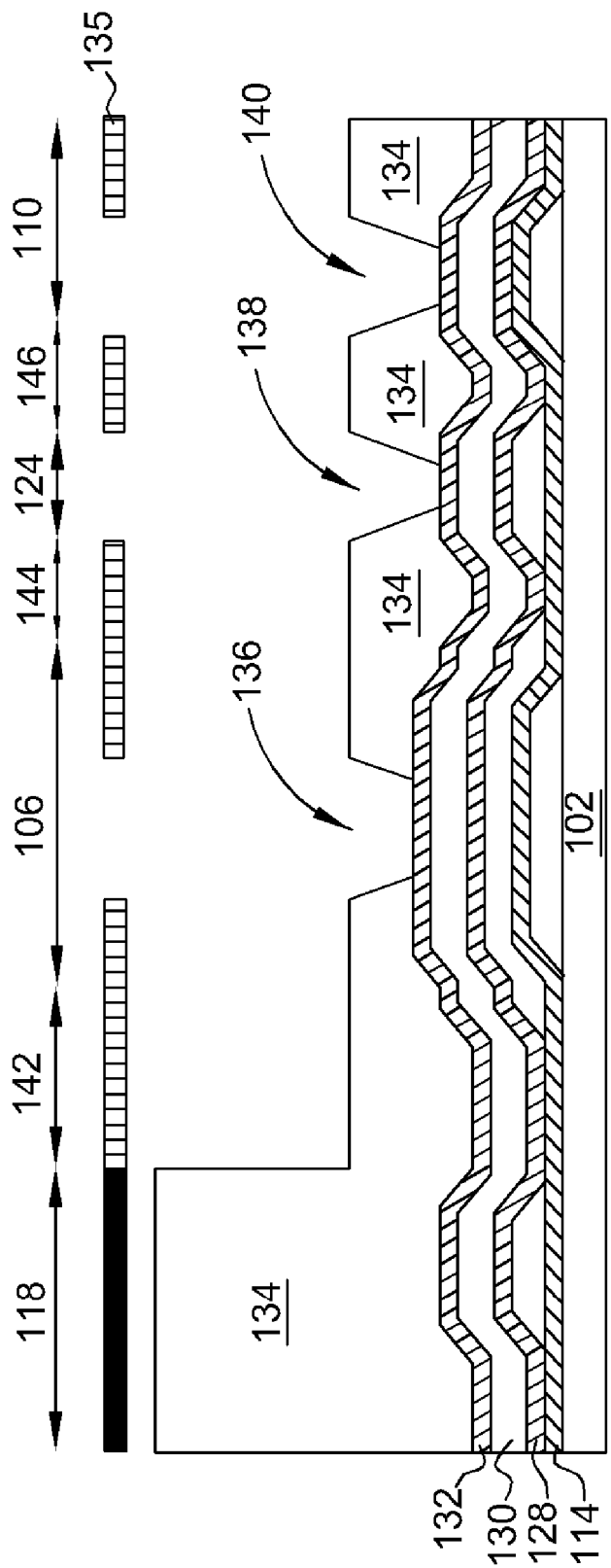

As shown in FIG. 11, a second insulating layer 128, an amorphous-silicon layer 130, and a doping layer 132 are deposited on the substrate 102 in sequence. A photoresist layer 134 is formed on the substrate 102 and a half-tone mask 135 is utilized for pattern transferring. Therein, the half-tone mask 135 includes a plurality of half-tone regions corresponding to positions of the first region 142, the storage capacitor region 106, the second region 144, the pad region 124, the third region 146, and the common electrode region 110. A third photolithographic and etching process is performed to pattern the photoresist layer 134 to define positions of a first through hole 136 on the storage capacitor region 106, a second through hole 138 on the pad region 124, and a third through hole 140 on the common electrode region 110, and form the photoresist layer 134 of a first thickness covering the thin film transistor region 118 and the photoresist layer 134 of a second thickness covering the first region 142, the storage capacitor region 106, the second region 144, the pad region 124, the third region 146, and the common electrode region 110. Therein, the first thickness is greater than the second thickness.

Figure 12:
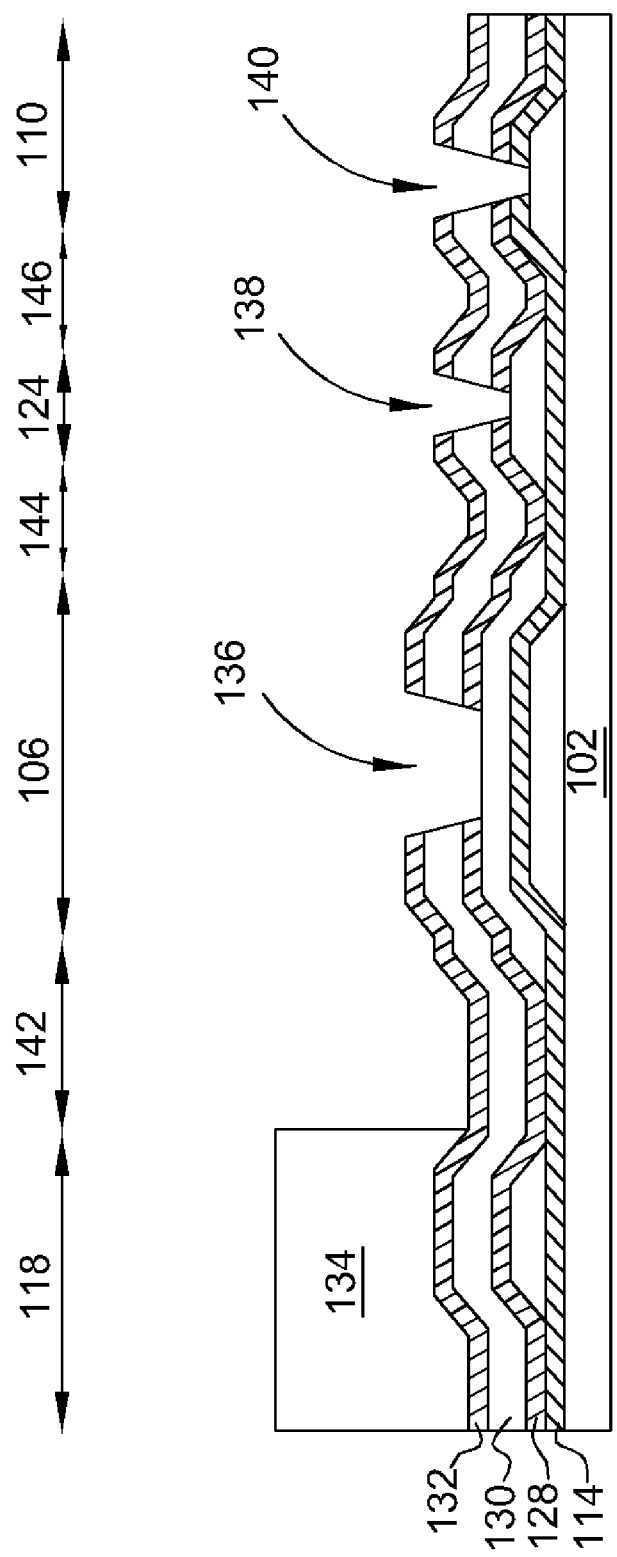

As shown in FIG. 12, utilizing the photoresist layer 134 as a mask, a first etching process is performed to etch and remove a portion of the doping layer 132, the amorphous-silicon layer 130, and the second insulation layer 128 on the storage capacitor region 106, the pad region 124, and the common electrode region 110, and a portion of the first insulation layer 114 on the common electrode region 110 to form the first through hole 136, the second through hole 138, and the third through hole 140. Then, a photoresist layer ashing process is performed to totally remove the photoresist layer 134 covering the first region 142, the storage capacitor region 106, the second region 144, the pad region 124, the third region 146, and the common electrode region 110, and partially remove the photoresist layer 134 covering the thin film transistor region 118. Therein, the first etching process and the photoresist layer ashing process can be performed in the same etching equipment to reduce the particle pollution because of moving.

Figure 13:
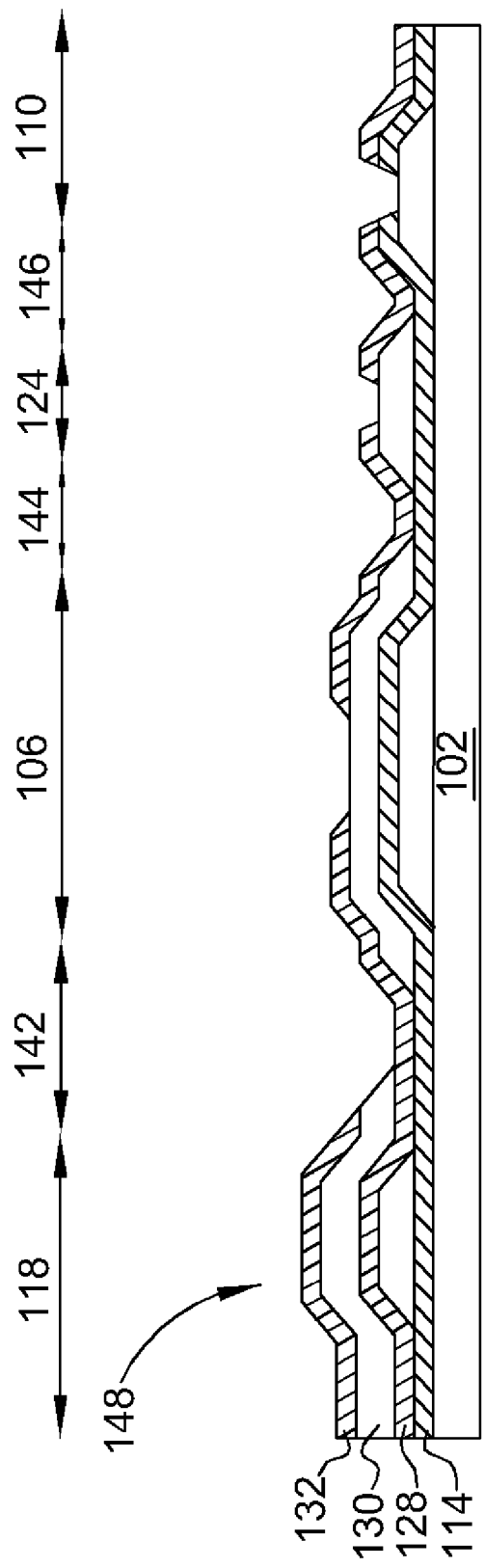

As shown in FIG. 13, utilizing the photoresist layer 134 as a mask, a second etching process is performed to etch and remove the doping layer 132 and the amorphous-silicon layer 130 covering the first region 142, the storage capacitor region 106, the second region 144, the pad region 124, the third region 146, and the common electrode region 110 to define a semiconductor island 148 on the thin film transistor region 118. Then the photoresist layer 134 covering the thin film transistor region 118 is removed.

Figure 14:
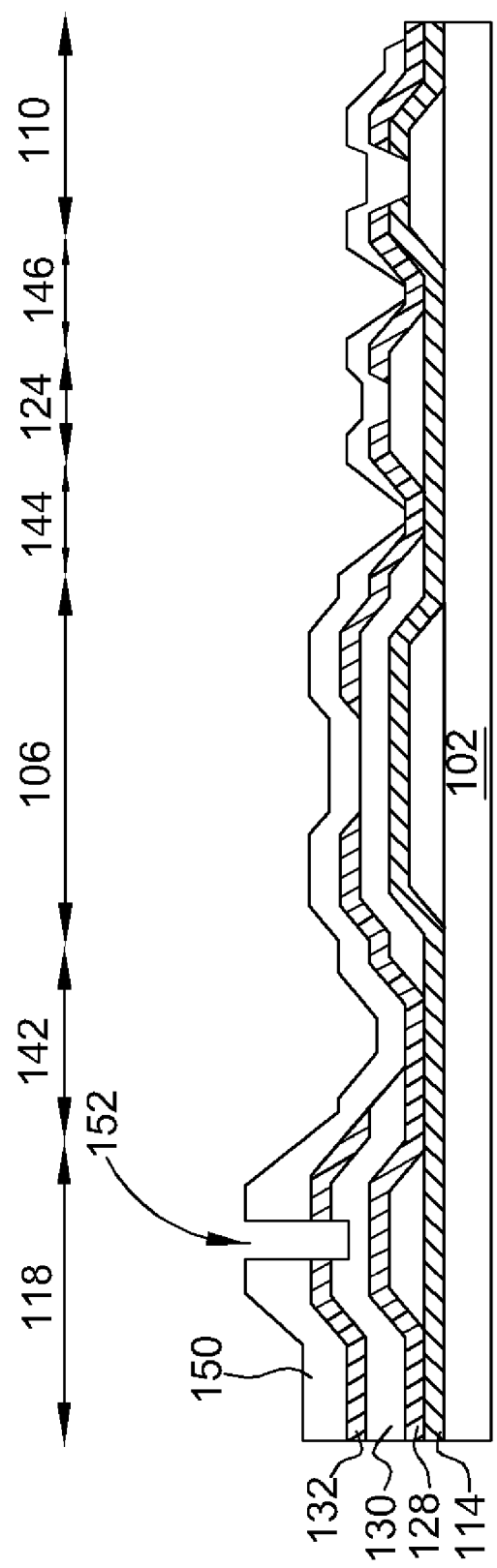

As shown in FIG. 14, a third metal layer 150 is formed on the substrate 102. A fourth photolithographic and etching process, especially a photolithographic and wet etching process, is performed to pattern the third metal layer 150 for exposing a portion of the doping layer 132 on the thin film transistor region 118 and forming a first broken circuit on the second region 144 and a second broken circuit on the third region 146 to isolate the storage capacitor region 106, the pad region 124, and the common electrode region 110. Then, a third etching process such as a dry etching process is performed to etch and remove a portion of the doping layer 132 and the amorphous-silicon layer 130 on the thin film transistor region 118, which is not covered by the third metal layer 150, to form a channel 152 on the thin film transistor region 118.

Figure 15:
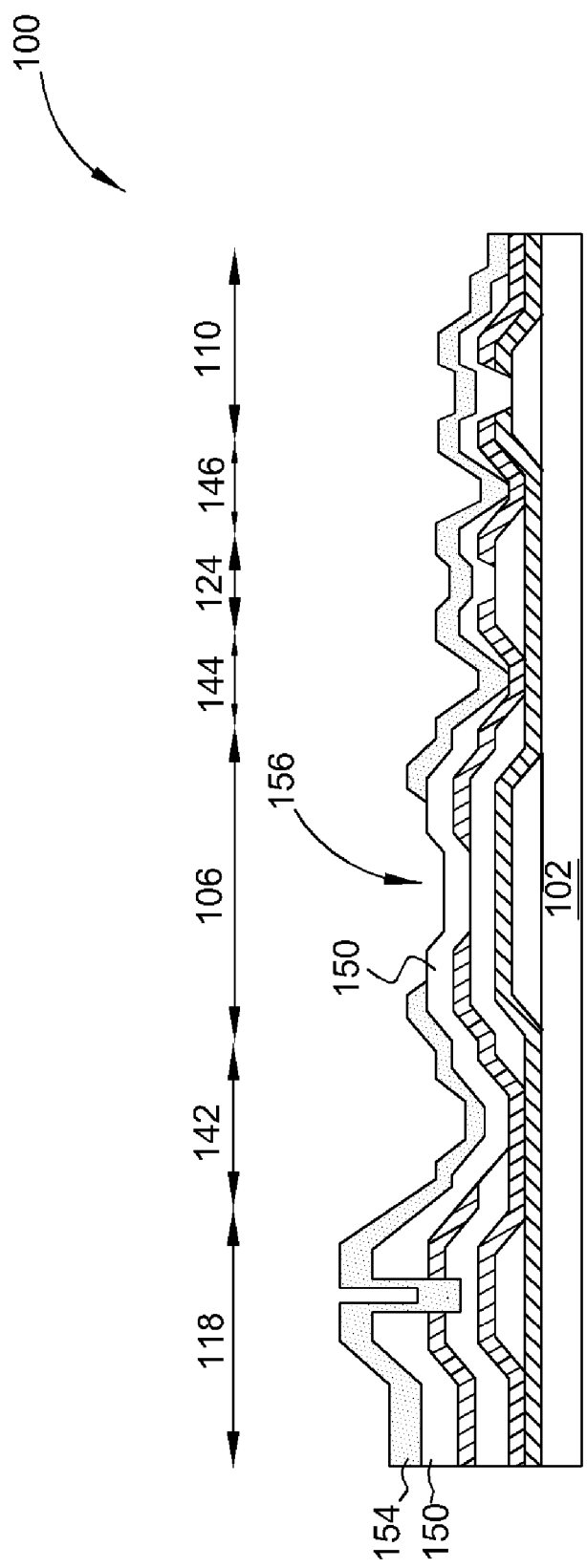

As shown in FIG. 15, a passivation layer 154 is deposited. A fifth photolithographic and etching process is performed to pattern the passivation layer 154 for exposing a portion of the third metal layer 150 on the storage capacitor region 106 to form a fourth through hole 156. Finally, a sixth photolithographic and etching process is performed to form outer test patterns (not shown in FIG. 15) to complete the manufacturing method of the image TFT array 100 according to a first embodiment of the present invention. The image TFT array 100 of the present invention can be an X-ray image TFT array.

Please refer to FIG. 16 to FIG. 22. FIG. 16 to FIG. 22 are schematic diagrams of a manufacturing method of an image TFT array 200 according to a second embodiment of the present invention. The difference between the first embodiment and the second embodiment of the present invention is that a half-tone process of the second embodiment uses a simpler half-tone mask, such that the cost of the half-tone mask is reduced. Furthermore, the object of the present invention of saving a photolithographic and etching process is also achieved.

Figure 16:
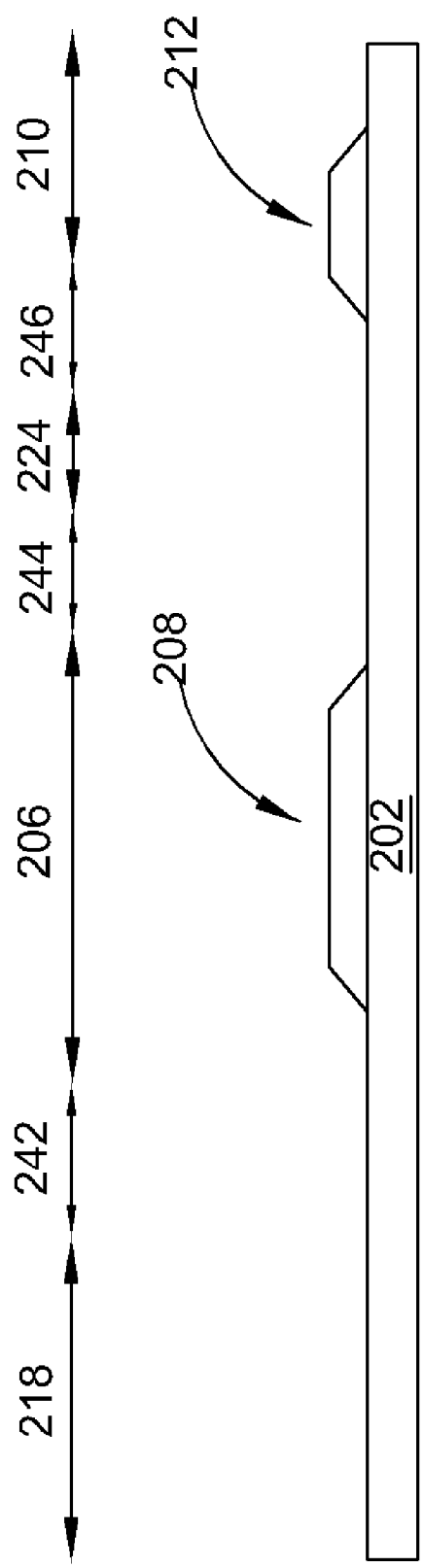
FIG. 16 to FIG. 22 are schematic diagrams of a manufacturing method of an image TFT array according to a second embodiment of the present invention.

As shown in FIG. 16, a substrate 202 is provided, and the substrate 202 includes a thin film transistor region 218, a first region 242, a storage capacitor region 206, a second region 244, a pad region 224, a third region 246, and a common electrode region 210. Therein, the first region 242 means the region between the thin film transistor region 218 and the storage capacitor region 206, the second region 244 means the region between the storage capacitor region 206 and the pad region 224, and the third region 246 means the region between the pad region 224 and the common electrode region 210. The substrate 202 can be a transparent glass or quartz substrate. Then, a first metal layer (not shown in FIG. 16) is deposited on the substrate 202. A first photolithographic and etching process is performed to pattern the first metal layer to form a lower electrode 208 on the storage capacitor region 206 and a common electrode 212 on a common electrode region 210.

Figure 17:
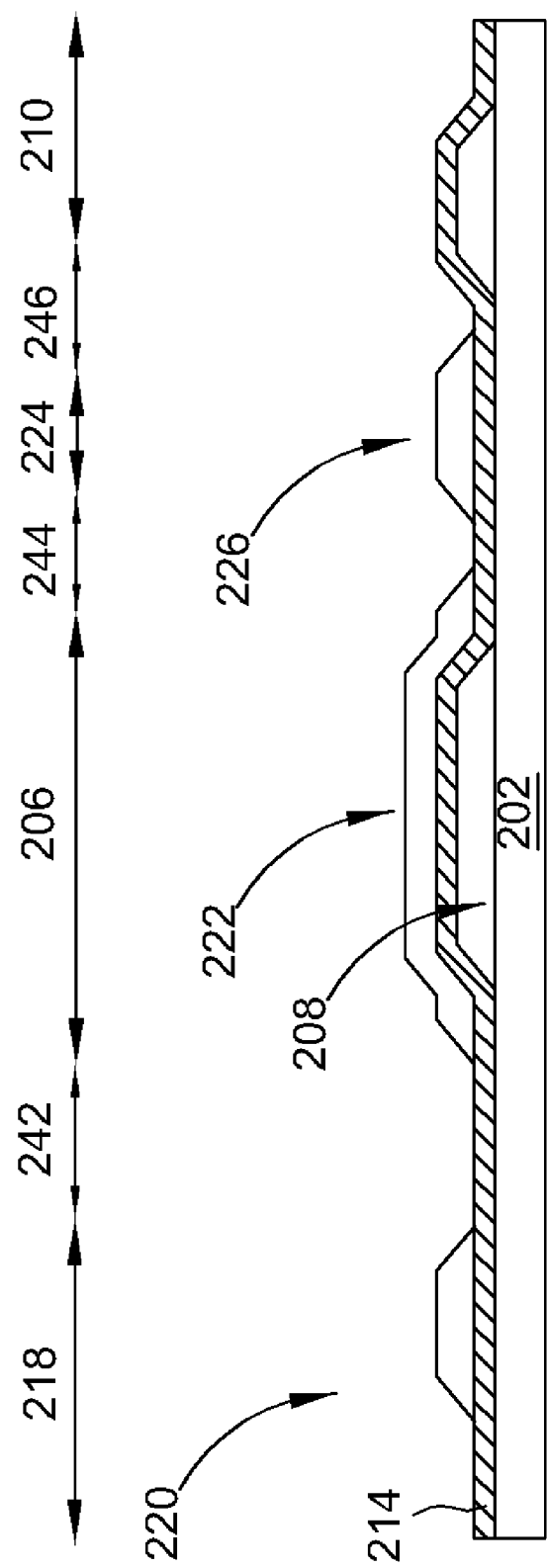

As shown in FIG. 17, a first insulating layer 214 and a second metal layer (not shown in FIG. 17) are deposited on the substrate 202 in sequence. A second photolithographic and etching process is performed to pattern the second metal layer to form a gate 220 on the thin film transistor region 218, an upper electrode 222 on the storage capacitor region 206, and a pad 226 on the pad region 224 covering the first insulating layer 214. Therein, the lower electrode 208, the first insulating layer 214, and the upper electrode 222 constitute a metal-insulator-metal (MIM) structure to form a storage capacitor.

Figure 18:
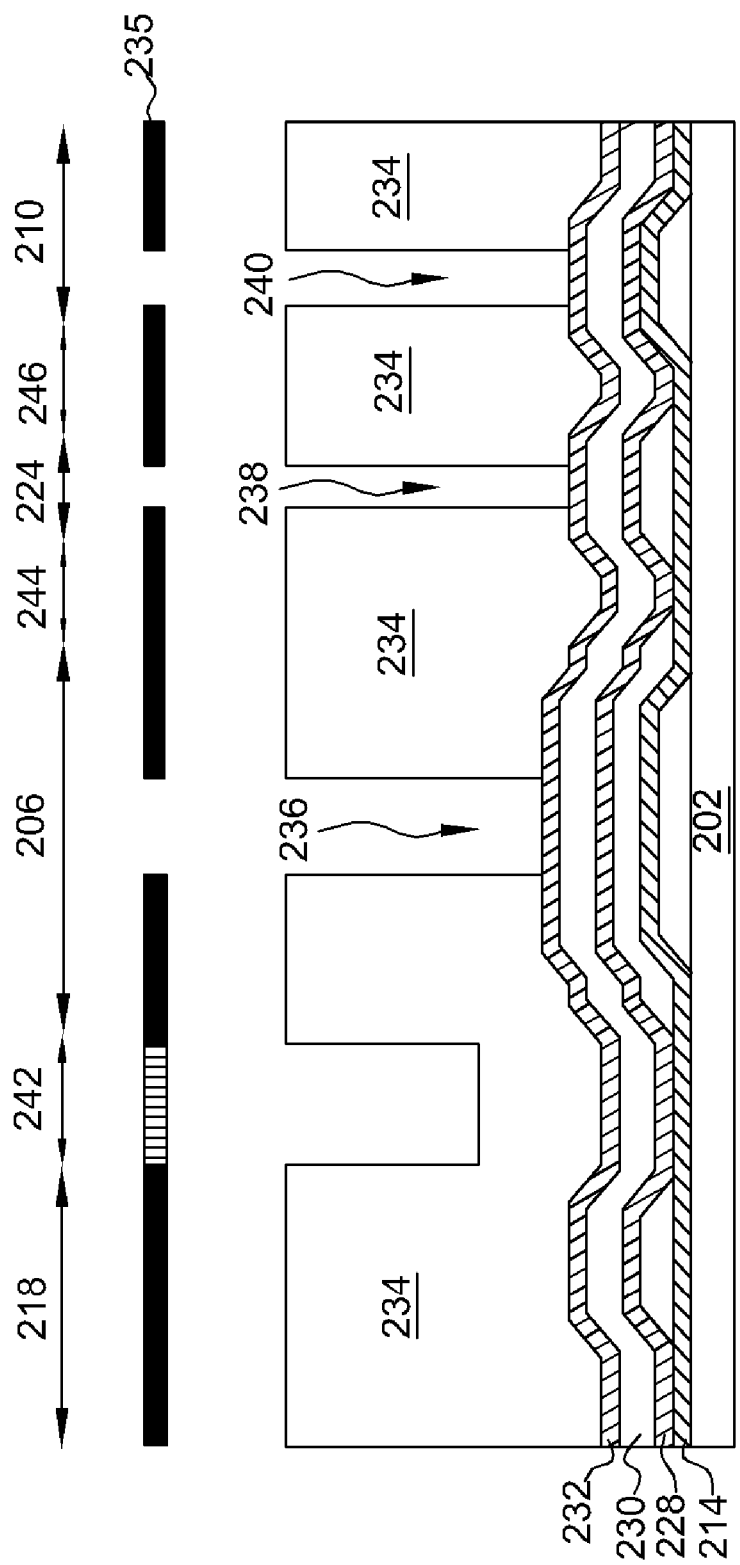

As shown in FIG. 18, a second insulating layer 228, an amorphous-silicon layer 230, and a doping layer 232 are deposited on the substrate 202 in sequence. A photoresist layer 234 is formed on the substrate 202 and a half-tone mask 235 is utilized for pattern transferring. Therein, the half-tone mask 235 includes a half-tone region corresponding to the first region 242. A third photolithographic and etching process is performed to pattern the photoresist layer 234 to define positions of a first through hole 236 on the storage capacitor region 206, a second through hole 238 on the pad region 224, and a third through hole 240 on the common electrode region 210, and form the photoresist layer 234 of a first thickness covering the thin film transistor region 218, the storage capacitor region 206, the second region 244, the pad region 224, the third region 246, and the common electrode region 210, and the photoresist layer 234 of a second thickness covering the first region 242. Therein, the first thickness is greater than the second thickness. Since the half-tone mask 235 of the second embodiment of the present invention only needs to manufacture a half-tone region corresponding to the first region 242, the cost of the half-tone mask 235 is reduced.

Figure 19:
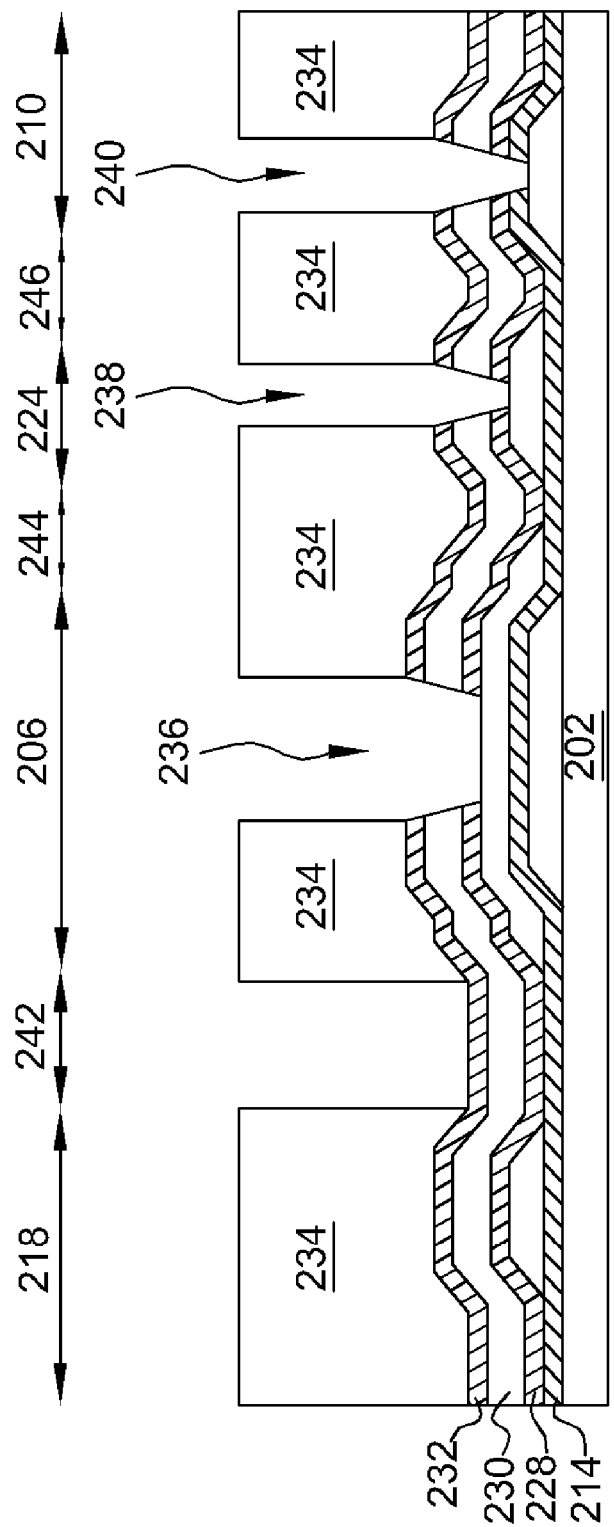

As shown in FIG. 19, utilizing the photoresist layer 234 as a mask, a first etching process is performed to etch and remove a portion of the doping layer 232, the amorphous-silicon layer 230, and the second insulation layer 228 on the storage capacitor region 206, the pad region 224, and the common electrode region 210, and a portion of the first insulation layer 214 on the common electrode region 210 to form the first through hole 236, the second through hole 238, and the third through hole 240. Then, a photoresist layer ashing process is performed to totally remove the photoresist layer 234 covering the first region 242, and partially remove the photoresist layer 234 covering the thin film transistor region 218, the storage capacitor region 206, the second region 244, the pad region 224, the third region 246, and the common electrode region 210. Therein, the first etching process and the photoresist layer ashing process can be performed in the same etching equipment to reduce the particle pollution because of moving.

Figure 20:
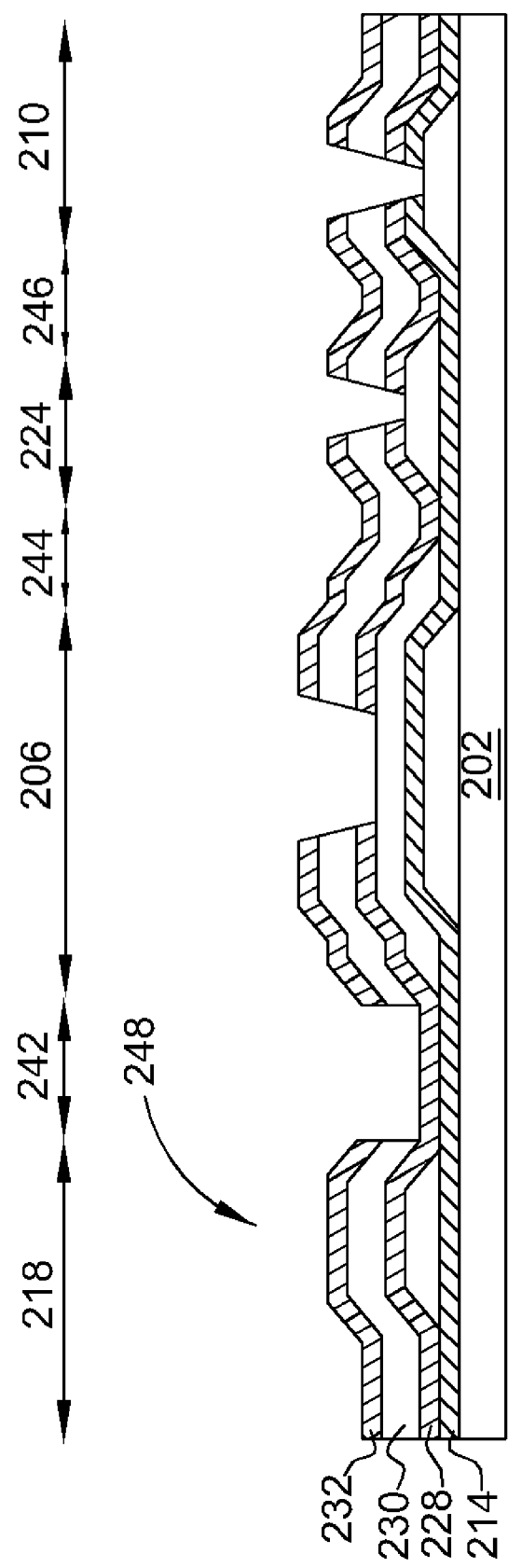

As shown in FIG. 20, utilizing the photoresist layer 234 as a mask, a second etching process is performed to etch and remove the doping layer 232 and the amorphous-silicon layer 230 covering the first region 242 to define a semiconductor island 248 on the thin film transistor region 218. Then, the remaining photoresist layer 234 covering the substrate 202 is removed.

Figure 21:
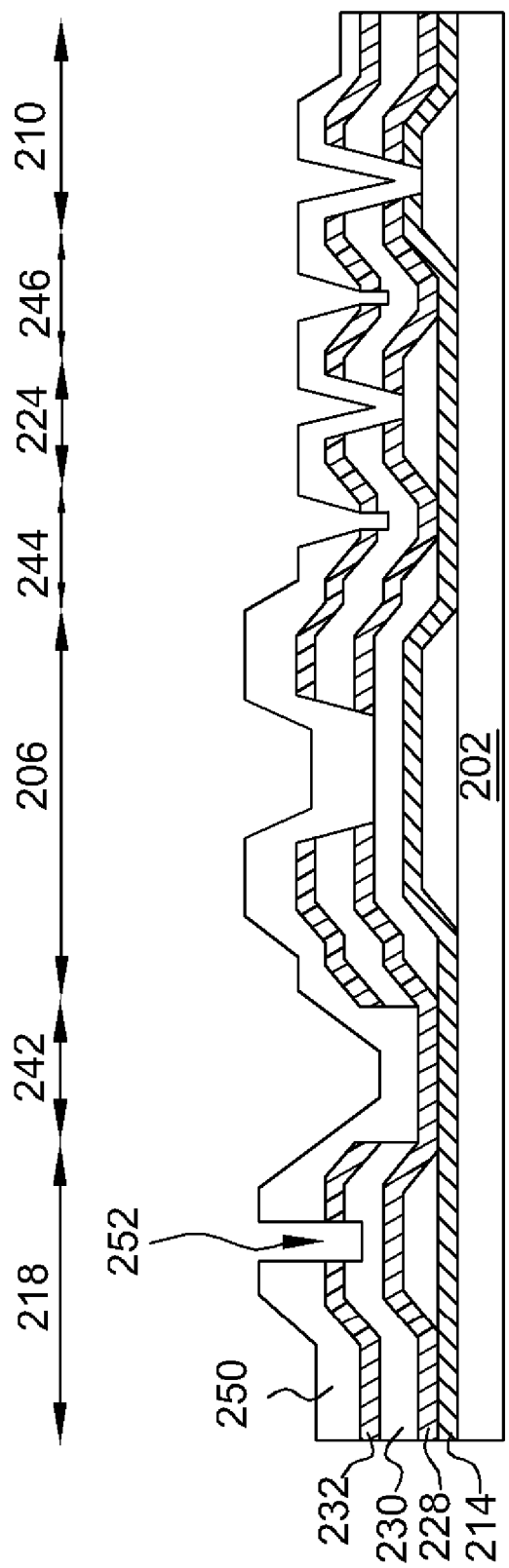

As shown in FIG. 21, a third metal layer 250 is formed on the substrate 202. A fourth photolithographic and etching process, especially a photolithographic and wet etching process, is performed to pattern the third metal layer 250 for exposing a portion of the doping layer 232 on the thin film transistor region 218, the second region 244, and the third region 246. Then, a etching process, especially a dry etching process, is performed to etch and remove a portion of the doping layer 232 and the amorphous-silicon layer 230 on the thin film transistor region 218, which is not covered by the third metal layer 250, to form a channel 252 on the thin film transistor region 218, and etch and remove a portion of the doping layer 232 and the amorphous-silicon layer 230 on the second region 244 and the third region 246, which is not covered by the third metal layer 250, to form a first broken circuit and a second broken circuit to isolate the storage capacitor region 206, the pad region 224, and the common electrode region 210.

Figure 22:
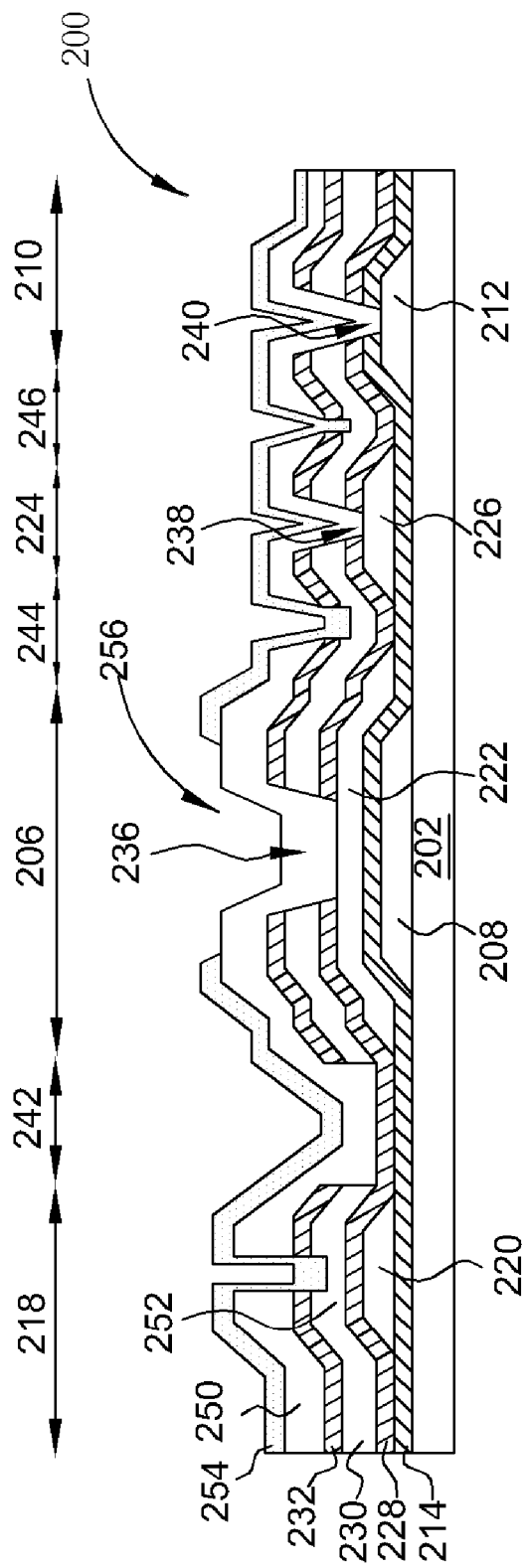

As shown in FIG. 22, a passivation layer 254 is deposited. A fifth photolithographic and etching process is performed to pattern the passivation layer 254 for exposing a portion of the third metal layer 250 on the storage capacitor region 206 to form a fourth through hole 256. Finally, a sixth photolithographic and etching process is performed to form outer test patterns (not shown in FIG. 22) to complete the manufacturing method of the image TFT array 200 according to the second embodiment of the present invention.

As shown in FIG. 22, the structure of the image TFT array 200 according to the second embodiment of the present invention is formed on the substrate 202. The structure of the image TFT array 200 includes a thin film transistor structure situated on the thin film transistor region 218, a storage capacitor structure situated on the storage capacitor region 206, a pad structure situated on the pad region 224, and a common electrode structure situated on the common electrode region 210. Therein, the thin film transistor structure is composed of the first insulating layer 214, the gate 220 formed by the second metal layer, the second insulating layer 228, the amorphous-silicon layer 230, the doping layer 232, the third metal layer 250, and the passivation layer 254. The storage capacitor structure is composed of the lower electrode 208 formed by the first metal layer, the first insulating layer 214, the upper electrode 222 formed by the second metal layer, the second insulating layer 228, the amorphous-silicon layer 230, the doping layer 232, the third metal layer 250, and the passivation layer 254. The pad structure is composed of the first insulating layer 214, the pad 226 formed by the second metal layer, the second insulating layer 228, the amorphous-silicon layer 230, the doping layer 232, the third metal layer 250, and the passivation layer 254. The common electrode structure is composed of the common electrode 212 formed by the first metal layer, the first insulating layer 214, the second insulating layer 228, the amorphous-silicon layer 230, the doping layer 232, the third metal layer 250, and the passivation layer 254.

The structure of the image TFT array 200 further includes the first through hole 236 on the storage capacitor region 206, the second through hole 238 on the pad region 224, and the third through hole 240 on the common electrode region 210 to let the third metal layer 250 electrically connect to the second metal layer on the storage capacitor region 206, the second metal layer on the pad region 224, and the first metal layer on the common electrode region 210. Moreover, the storage capacitor region 206 further includes the fourth through hole 256 for exposing a portion of the third metal layer 250.

According to the structure of the image TFT array 200, the third metal layer 250, the doping layer 232, and the amorphous-silicon layer 230 on the thin film transistor region 218 is partially removed to form the channel 252. The passivation layer 254 covers the channel 252 surface and connects to the amorphous-silicon layer 230. On the first region 242, the first insulating layer 214, the second insulating layer 228, the third metal layer 250, and the passivation layer 254 cover the substrate 202 surface. Furthermore, for isolating the storage capacitor region 206, the pad region 224, and the common electrode region 210, the second region 244 and the third region 246 include the first insulating layer 214, the second insulating layer 228, the amorphous-silicon layer 230, and the passivation layer 254 covering the substrate 202 surface.

Compared to the prior art, the present invention utilizes a half-tone process to integrate the manufacturing process of through holes on a storage capacitor, a pad, and a common electrode, and the manufacturing process of a semiconductor island on a thin film transistor. The present invention is capable of saving a photolithographic and etching process such that the particle issue produced in the transferring and etching process because of high number of photolithographic and etching process in the prior art will be improved. Therefore, the present invention is capable of simplifying the manufacturing process, shortening the manufacturing time, and increasing the quantity of output. Furthermore, the structure of an image TFT array of the present invention is manufactured by utilizing a simpler half-tone mask to achieve the object of saving a photolithographic and etching process, and therefore the cost of the image TFT array is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image TFT array, comprising:
   a substrate;
   a thin film transistor structure disposed on the substrate;
   a storage capacitor structure disposed on the substrate and sequentially composed of a first metal layer formed by a first photolithographic and etching process, a first insulating layer, a second metal layer formed by a second photolithographic and etching process, a second insulating layer, an amorphous-silicon layer, a doping layer and a first through hole formed by a third photolithographic and etching process, and a third metal layer, a passivation layer; and
   a common electrode structure disposed on the substrate and sequentially composed of the first metal layer, the first insulating layer, the second insulating layer, the amorphous-silicon layer, the doping layer, the third metal layer connecting to the first metal layer through a third through hole formed by the third photolithographic and etching process, the third metal layer, and the passivation layer, and the first insulating layer, the second insulating layer, the amorphous-silicon layer and the doping layer in the common electrode structure being formed by the third photolithographic and etching process.

2. The image TFT array of claim 1 further comprising:
   a pad structure disposed on the substrate composed of the first insulating layer, the second metal layer, the second insulating layer, the amorphous-silicon layer, the doping layer, the third metal layer connecting to the second metal layer through a second through hole formed by the third photolithographic and etching process, and the passivation layer, and the second insulating layer, the amorphous-silicon layer and the doping layer in the pad structure being formed by the third photolithographic and etching process.

3. The image TFT array of claim 1, wherein the third metal layer is electrically connected to the second metal layer through the first through hole.

4. The image TFT array of claim 1, wherein the thin film transistor structure is sequentially composed of the first metal layer, the first insulating layer, the second metal layer, the second insulating layer, the amorphous-silicon layer, the doping layer, the third metal layer, and the passivation layer connecting to the amorphous-silicon layer.

\* \* \* \* \*